(12) United States Patent
Chou

(10) Patent No.: US 7,402,791 B2
(45) Date of Patent: Jul. 22, 2008

(54) SWITCH HAVING A BALL MEMBER

(76) Inventor: Tien-Ming Chou, No. 41, San-Hsi 5th St., Taichung City (TW)

( * ) Notice: Subject to any disclaimer, the term of this patent is extended or adjusted under 35 U.S.C. 154(b) by 0 days.

(21) Appl. No.: 11/498,683

(22) Filed: Aug. 3, 2006

(65) Prior Publication Data

US 2008/0029771 A1    Feb. 7, 2008

(51) Int. Cl.
*G01D 5/34* (2006.01)
(52) U.S. Cl. .................................................. 250/231.1
(58) Field of Classification Search ............... 250/231.1, 250/239, 221, 222.1, 216, 229
See application file for complete search history.

(56) References Cited

U.S. PATENT DOCUMENTS 6,392,223 B1 *  5/2002  Hjertman et al. ......... 250/231.1
6,800,841 B1 * 10/2004  Chou ....................... 250/231.1

* cited by examiner

*Primary Examiner*—Leonardo Andujar
*Assistant Examiner*—Fei Fei Yeung Lopez
(74) *Attorney, Agent, or Firm*—Brooks Kushman P.C.

(57) ABSTRACT

A switch includes a housing, an emitter disposed in the housing and having an emitter head to emit a light signal, and a receiver disposed in the housing and having a receiver head to receive the light signal. A receptacle is disposed in the housing, and includes a first wall having a light exit hole aligned with the emitter head, a second wall proximate to the receiver, and a tubular wall cooperating with the first and second walls to define a chamber having a tapered portion that gradually converges from the tubular wall toward the light exit hole. The second wall has a projection projecting into the chamber. The emitter head, the light exit hole, the projection, and the receiver head are aligned with each other along a light path. A ball member is rollable within the chamber.

6 Claims, 12 Drawing Sheets

SWITCH HAVING A BALL MEMBER

BACKGROUND OF THE INVENTION

1. Field of the Invention

The invention relates to a switch, more particularly to a switch that has a ball member.

2. Description of the Related Art

Referring to FIGS. 1 to 3, a conventional switch 10, as disclosed by the applicant in U.S. Pat. No. 6,800,841, includes an insulating housing body 11, an emitter 12, a receiver 13, a modular insert body 14, a ball member 15, and a modular cover 16.

The housing body 11 has a top opening, and includes a bottom wall 111, a surrounding wall 113 extending upwardly from a peripheral end of the bottom wall 111 and cooperating with the same to define a first chamber 112, spaced-apart first and second partition walls 114, 115 extending upwardly from the bottom wall 111 into the first chamber 112, a first slot 116 formed in the first partition wall 114, and a second slot 117 formed in the second partition wall 115.

The emitter 12 includes an emitter body 121 disposed between the first partition wall 114 and the surrounding wall 113, an emitter head 122 projecting from the emitter body 121 into the first slot 116, and two contact terminals 123 projecting downwardly from the emitter body 121 and extending through the bottom wall 111 of the housing body 11.

The receiver 13 includes a receiver body 131 disposed between the second partition wall 115 and the surrounding wall 113, a receiver head 132 projecting from the receiver body 131 into the second slot 117, and two contact terminals 133 projecting downwardly from the receiver body 131 and extending through the bottom wall 111 of the housing body 11. The receiver head 132 and the emitter head 122 cooperatively form a light path (I).

The modular insert body 14 is disposed in the first chamber 112 between the first and second partition walls 114, 115, and includes an end wall 141 abutting against the first partition wall 114, a cylindrical peripheral wall 143 extending outwardly toward the second partition wall 115 from a peripheral end of the end wall 141 and cooperating with the same to define a second chamber 142, and an aperture 144 formed in the end wall 141 and aligned with the emitter and receiver heads 122, 132 along the light path (I). The second chamber 142 has a tapered portion 145 that converges from the peripheral wall 143 to the aperture 144.

The ball member 15 is rollable within the second chamber 142 to block or unblock the light path (I).

The modular cover 16 covers the top opening of the housing 11, and includes a top wall 161, and two press pieces 162 projecting downwardly from the top wall 161 so as to press respectively against the emitter and receiver bodies 121, 131.

In use, the contact terminals 123, 133 of the emitter 12 and the receiver 13 are fixed on a circuit board 17. With reference to FIG. 2, when the circuit board 17 is parallel to a reference horizontal surface (II), the ball member 15 unblocks the light path (I), so that light emitting from the emitter head 122 can pass through the aperture 144 and be received by the receiver head 132. The switch 10 is in an "ON" state at this time.

With reference to FIG. 3, when the switch 10 is turned such that the circuit board 17 is perpendicular to the reference horizontal surface (II) and the receiver head 132 is above the emitter head 122, the ball member 15 rolls toward the aperture 144 so as to block the light path (I), thereby placing the switch 10 in an "OFF" state.

Although the aforementioned switch 10 can achieve its intended purpose, when the ball member 15 rolls to the second partition wall 115 or toward an area adjacent to the second slot 117 during movement of a device to which the switch 10 is applied, the ball member 15 can undesirably interfere with the light so that the light is not received by the receiver head 132. This increases the incidence of erroneous operation of the switch 10.

SUMMARY OF THE INVENTION

Therefore, the object of the present invention is to provide a switch that has a high sensitivity and that can minimize erroneous operation of the switch.

According to this invention, a switch comprises a housing, an emitter, a receiver, a receptacle, and a ball member. The emitter includes an emitter main body disposed in the housing, and an emitter head to emit a light signal. The receiver includes a receiver main body disposed in the housing, and a receiver head to receive the light signal. The receptacle is disposed in the housing, and includes a first wall proximate to the emitter and having a light exit hole aligned with the emitter head, a second wall proximate to the receiver, and a tubular wall connected between the first and second walls. The first and second walls and the tubular wall define a chamber having a tapered portion that gradually converges from the tubular wall toward the light exit hole. The second wall has a projection projecting into the chamber from an inner surface of the second wall. The emitter head, the light exit hole, the projection, and the receiver head are aligned with each other along a light path. The ball member is rollable within the chamber.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
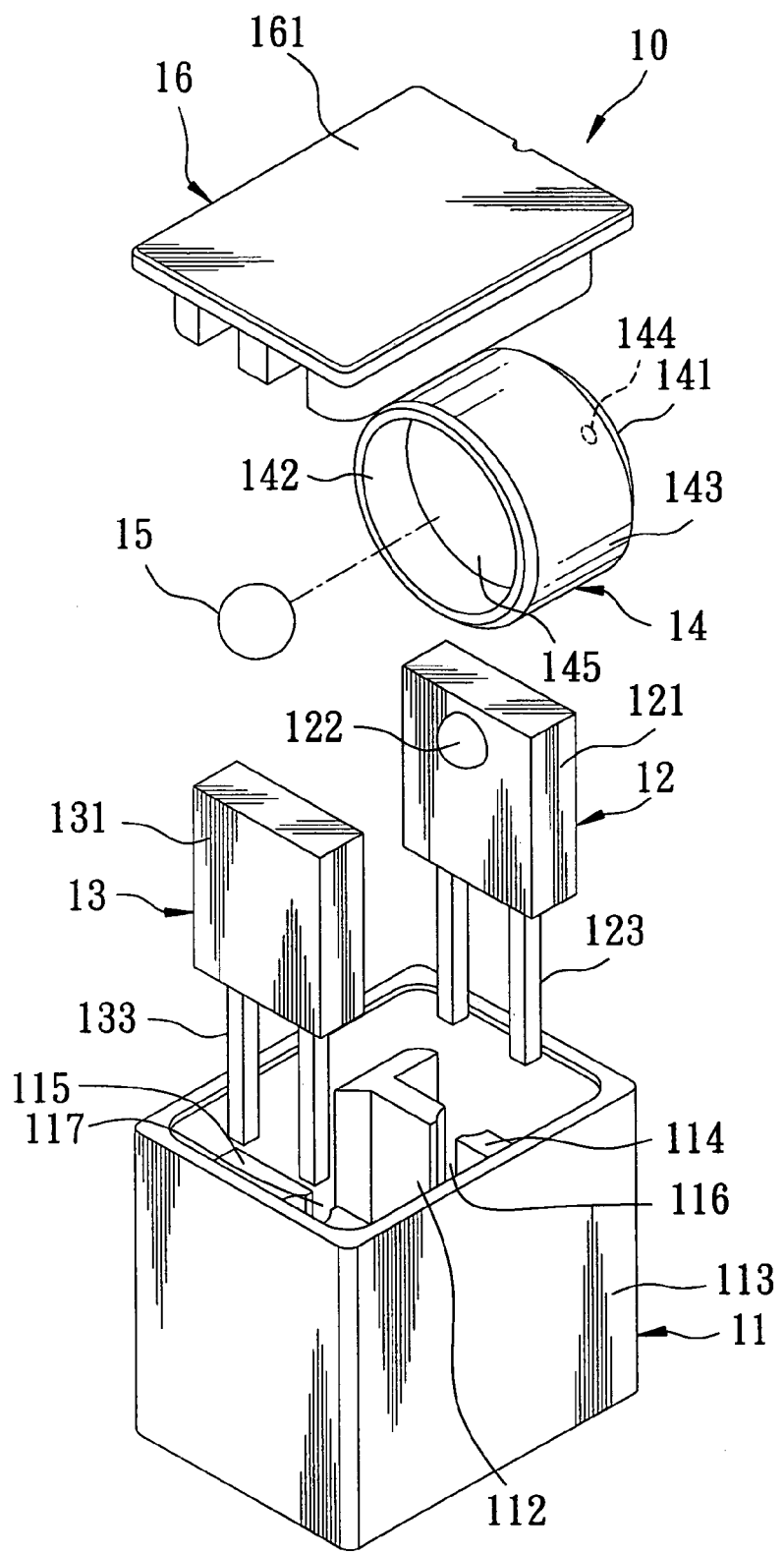
FIG. 1 is an exploded perspective view of a switch disclosed in U.S. Pat. No. 6,800,841.
Figure 2:
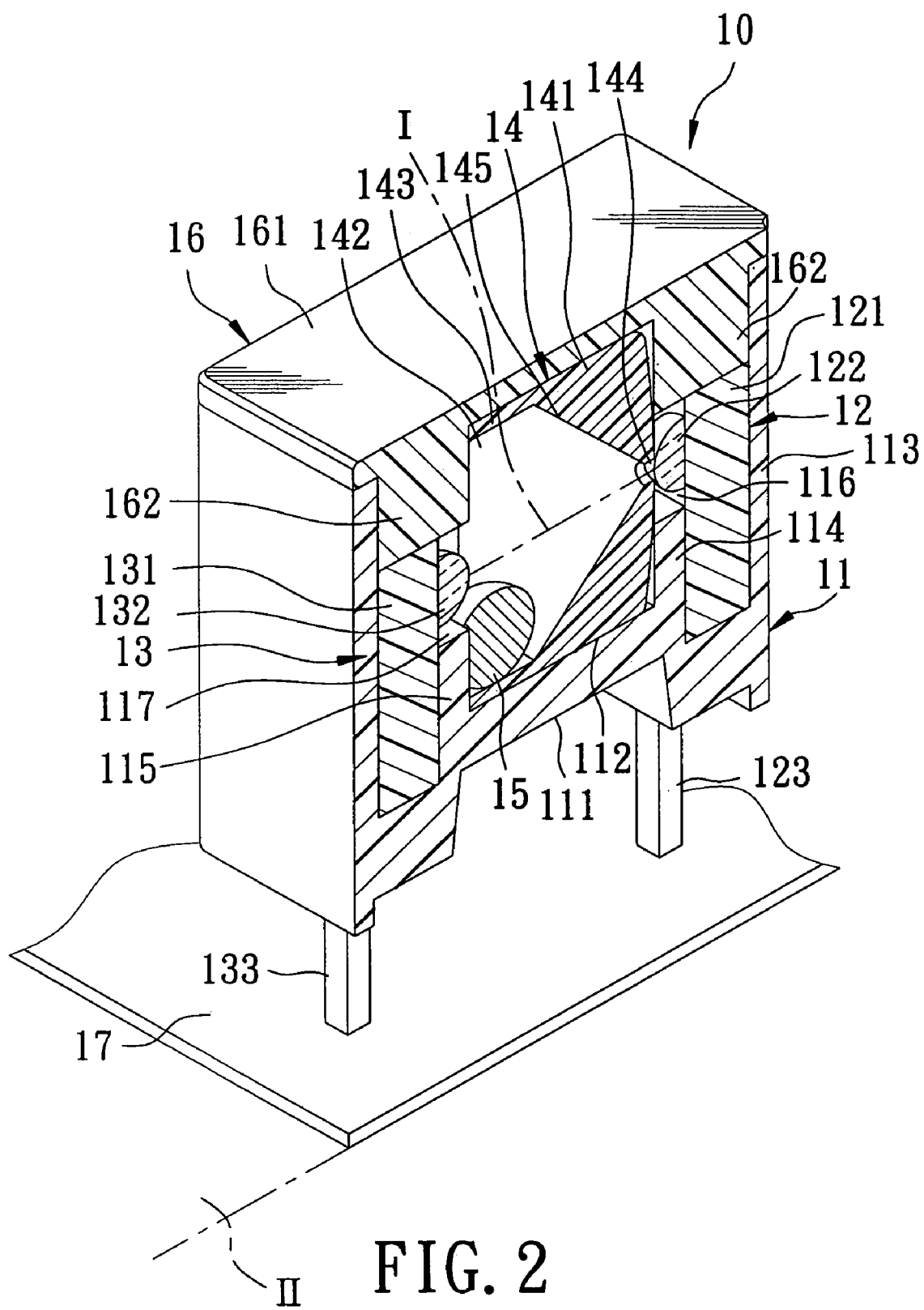
FIG. 2 is a sectional view of the switch of FIG. 1 in an "ON" state.
Figure 3:
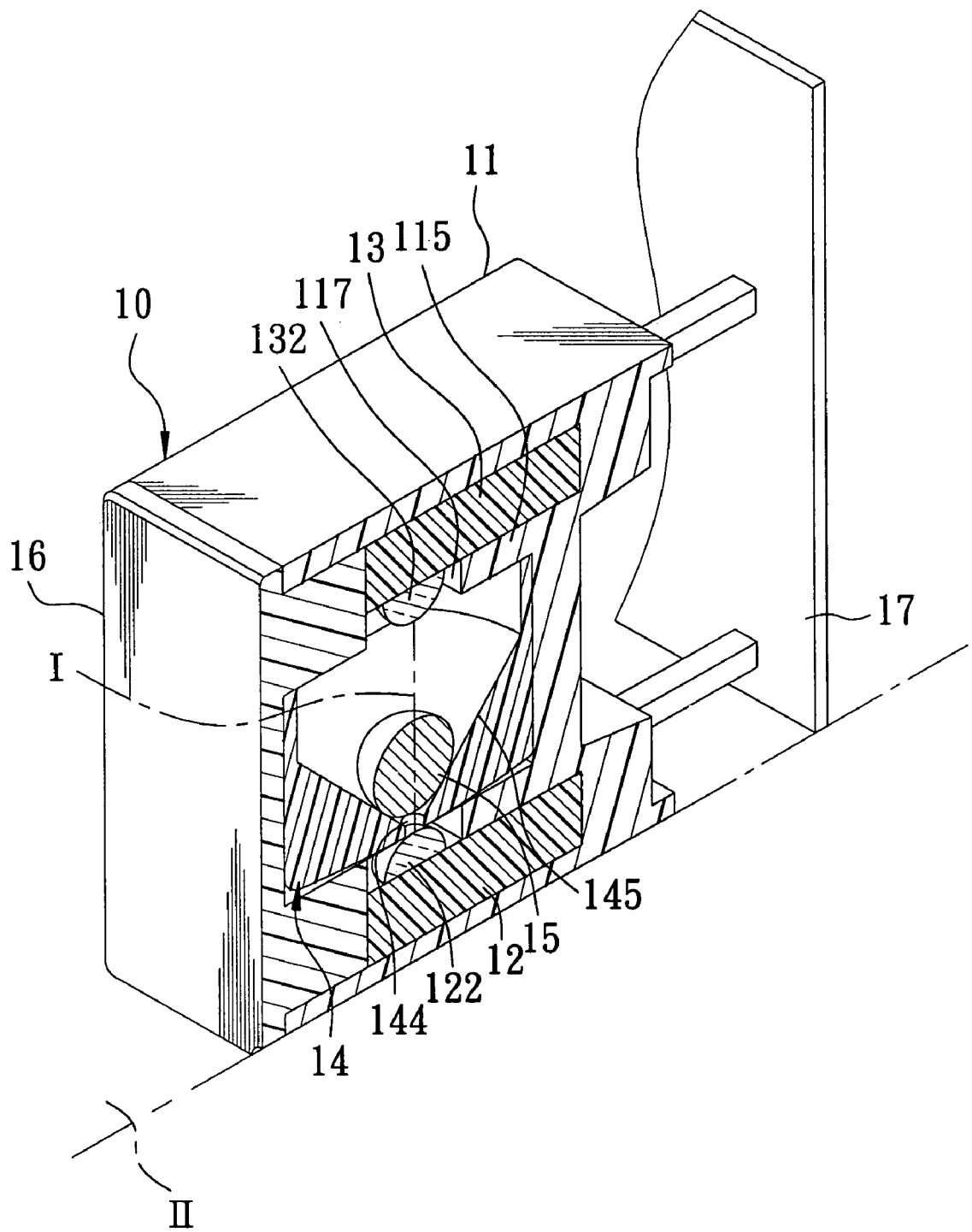
FIG. 3 is a view similar to FIG. 2, but with the switch in an "OFF" state.
Figure 4:
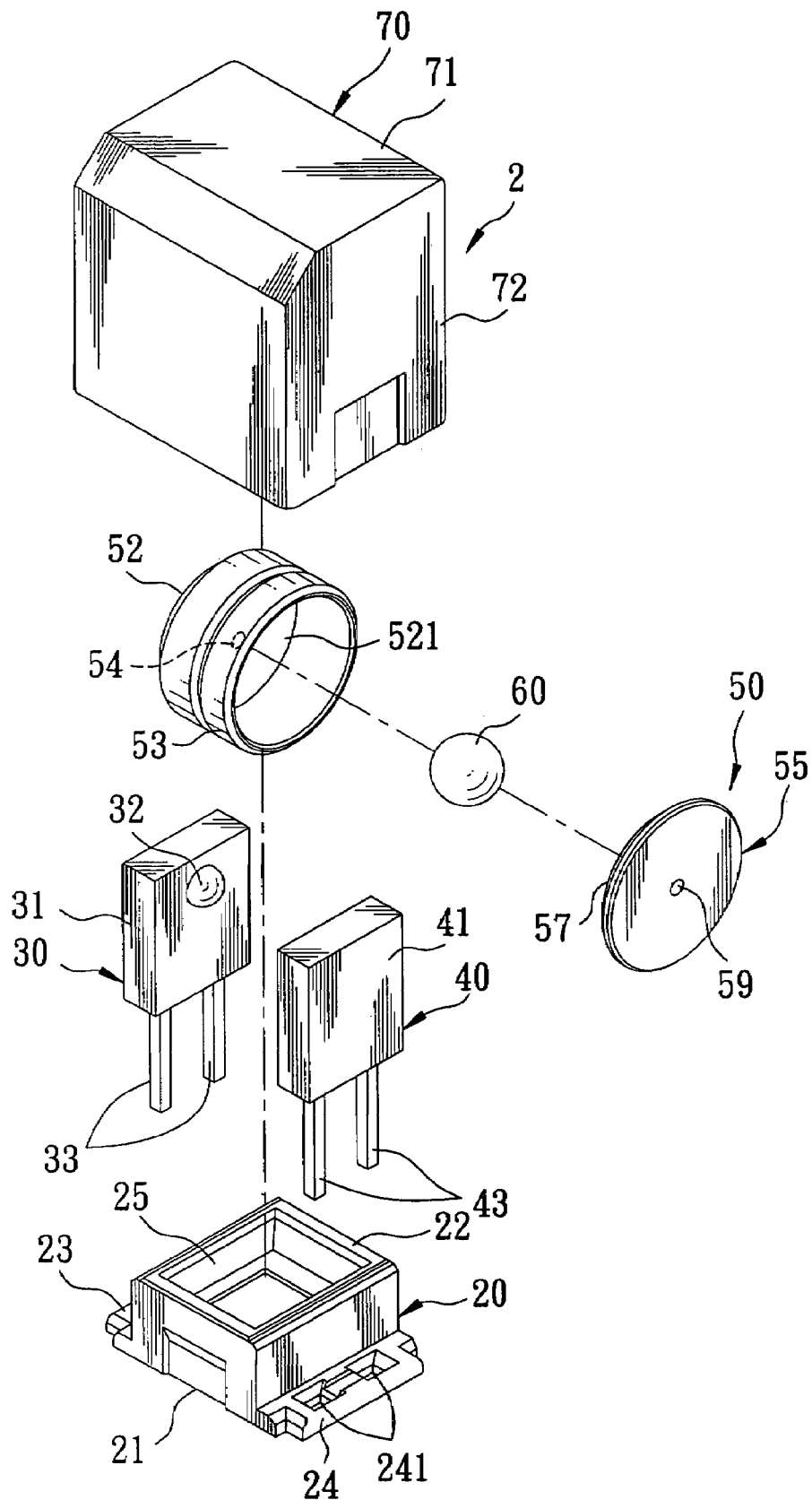
FIG. 4 is an exploded perspective view of the first preferred embodiment of a switch according to the present invention.
Figure 5:
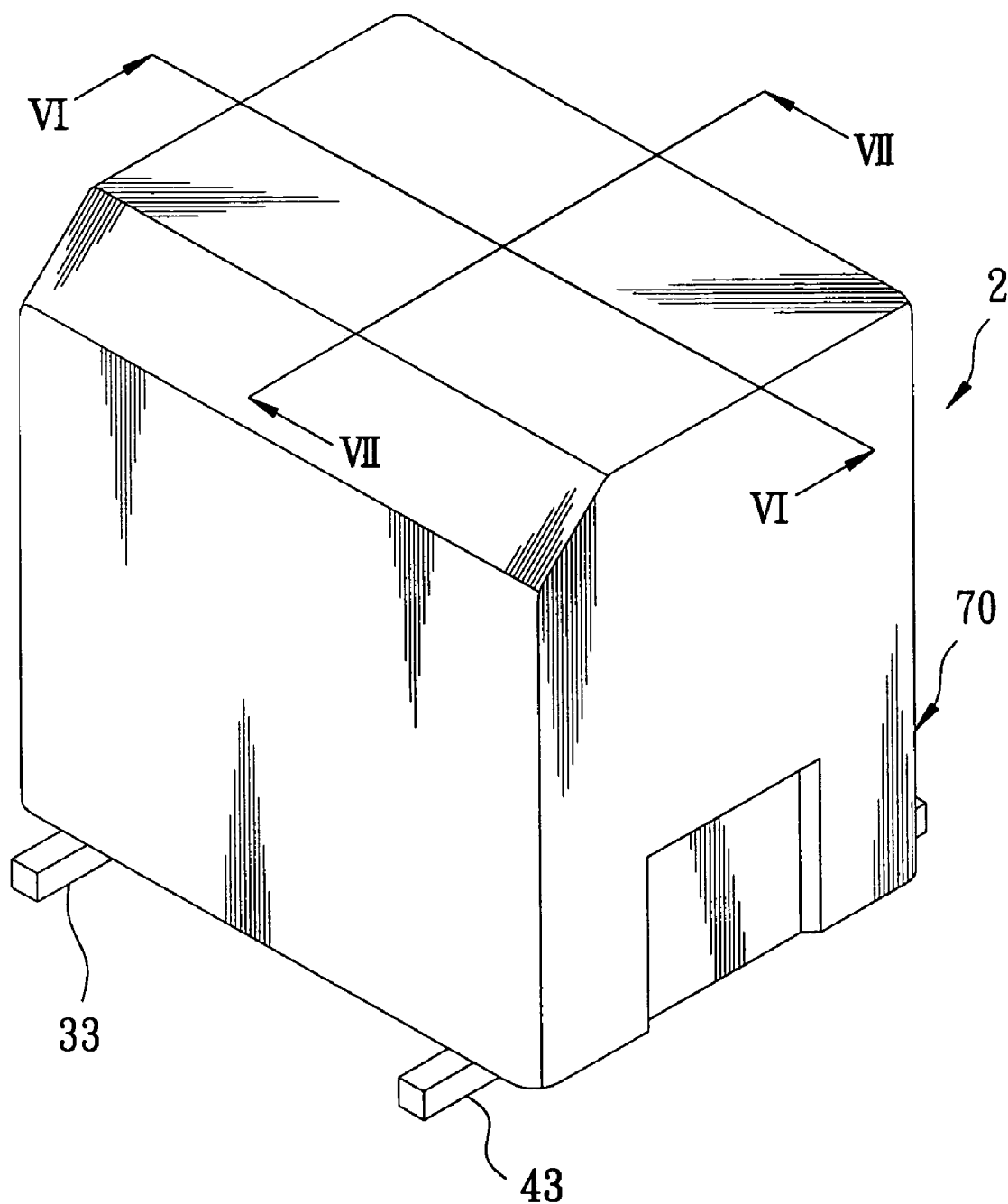
FIG. 5 is an assembled perspective view of the first preferred embodiment.

Before the present invention is described in greater detail, it should be noted that like elements are denoted by the same reference numerals throughout the disclosure.

Referring to FIGS. 4 to 10, the first preferred embodiment of a switch 2 according to the present invention is shown to comprise a housing, an emitter 30, a receiver 40, a receptacle 50, and a ball member 60.

The housing includes a base 20 and a cover body 70. The base 20 has a bottom wall 21, a surrounding wall 22 extending upwardly from a peripheral end of the bottom wall 21, and first and second extension parts 23, 24 extending outwardly and respectively from two opposite ends of the bottom wall 21. The bottom wall 21 and the surrounding wall 22 cooperatively define a lower recess 25. Each of the first and second extension parts 23, 24 has two spaced-apart through holes 231, 241.

The cover body 70 includes a top wall 71, and a surrounding wall 72 extending downwardly from a peripheral end of the top wall 71.

The emitter 30, in this embodiment, is an infrared light emitter, and includes an emitter main body 31 seated on the first extension part 23, an emitter head 32 projecting from one side of the emitter main body 31 to emit a light signal, and two contact terminals 33 extending downwardly from the emitter main body 31 and out of the first extension part 23 via the respective through holes 231.

The receiver 40 has a receiver main body 41 seated on the second extension part 24, a receiver head 42 projecting from one side of the receiver main body 41 to receive the light signal emitted by the emitter head 32, and two contact terminals 43 extending downwardly from the receiver main body 41 and out of the second extension part 24 via the respective through holes 241.

The cover body 70 surrounds the bottom wall 21, the surrounding wall 22, the first and second extension parts 23, 24, and the emitter and receiver main bodies 31, 41. The cover body 70 further has an annular rib 73 projecting downwardly from an inner wall face 711 of the top wall 71 to press against the emitter and receiver main bodies 31, 41, respectively, and an upper recess 74 defined by the annular projection 73 and the top wall 71.

The receptacle 50 is disposed in the housing within the upper and lower recesses 74, 25, and includes a first wall 52 proximate to the emitter 30 and having a light exit hole 54 aligned with the emitter head 32, a second wall 55 proximate to the receiver 40, and a tubular wall 53 connected between the first and second walls 52, 55. The first and second walls 52, 55 and the tubular wall 53 define a chamber 500 having a tapered portion 521 that gradually converges from the tubular wall 53 toward the light exit hole 54. The first wall 52 and the tubular wall 53 are formed integrally, while the second wall 55 is a plate formed separately from the tubular wall 53.

The second wall 55, in this embodiment, is made of a non-transparent material, such as plastic. The second wall 55 abuts against an end face of the tubular wall 53, and has a projection 58 projecting into the chamber 500 from an inner surface of the second wall 55, a light entry hole 59 that extends through the second wall 55 and the projection 58 and that is aligned with the receiver head 42, and an annular protrusion 57 surrounding the projection 58 and abutting against an inner surface of the tubular wall 53. The light entry hole 59 and the light exit hole 54 are aligned with each other along a light path (I).

The ball member 60 is rollable within the chamber 500, and has a diameter smaller than a distance from the tubular wall 53 to the light path (I). The ball member 60, in this embodiment, is made of a non-transparent material, and is movable to block and unblock the light path (I).

After assembly, a sealing layer 80 (see FIG. 6) is bonded to bottom sides of the bottom wall 21 and the first and second extension parts 23, 24 of the base 20, the surrounding wall 72 of the cover body 70, and the contact terminals 33, 43 of the emitter 30 and the receiver 40. As such, the switch 2 is sealed, and the components are securely and effectively positioned.

Figure 6:
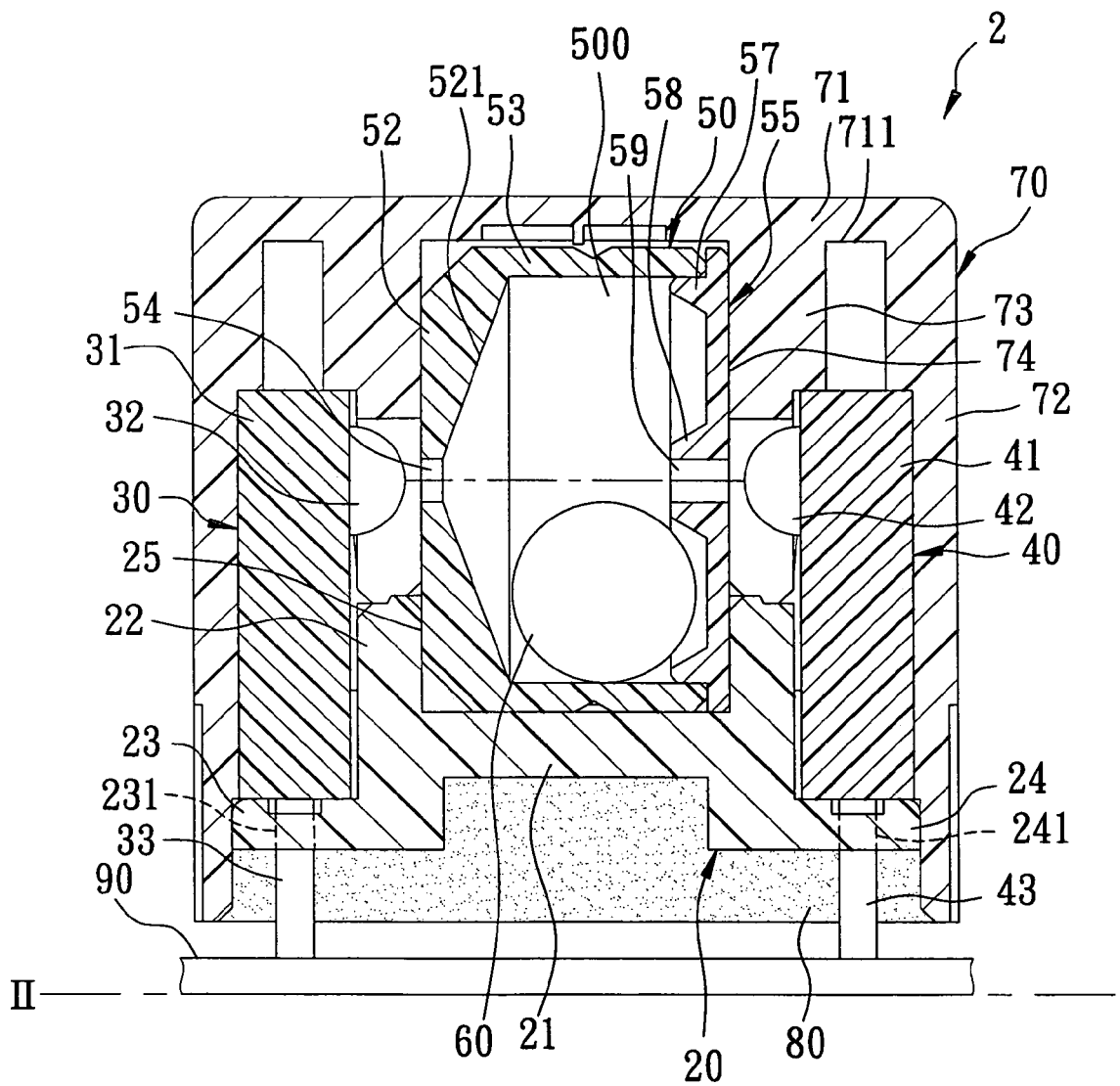
FIG. 6 is an assembled sectional view of the first preferred embodiment taken along line VI-VI of FIG. 5 with a ball member in an unblocking position.
Figure 7:
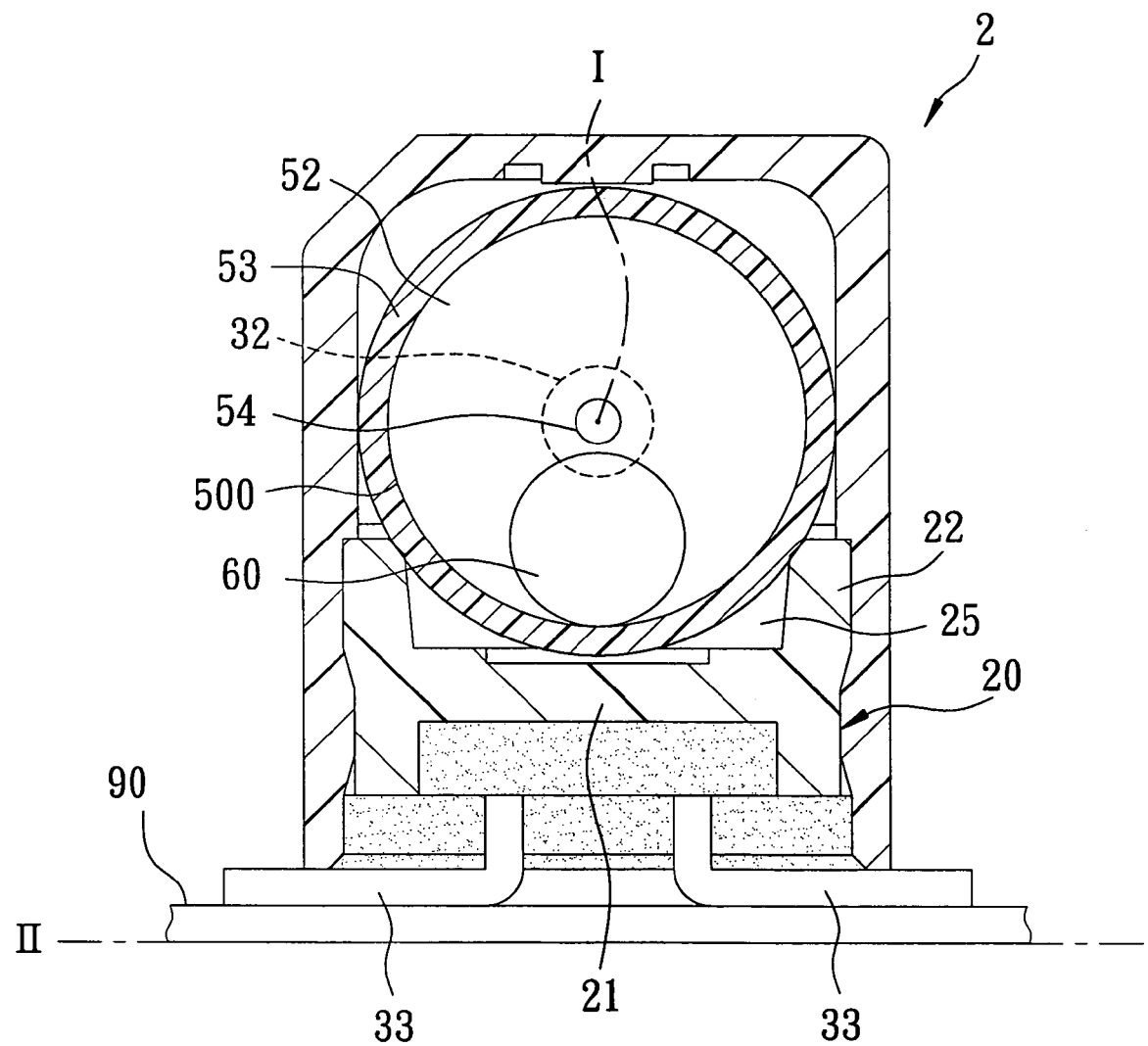
FIG. 7 is an assembled sectional view of the first preferred embodiment taken along line VII-VII of FIG. 5 with the ball member in the unblocking position.

In use, with reference to FIGS. 6 and 7, when the contact terminals 33, 43 are fixed on a circuit board 90, and the circuit board 90 is parallel to a reference horizontal surface (II), the ball member 60 is positioned on the tubular wall 53 by virtue of gravity, and unblocks the light path (I). At this time, the light signal emitted by the emitter head 32 can pass smoothly through the light exit hole 54, the chamber 500, and the light entry hole 59 so as to be received by the receiver head 42. This places the switch 2 in an "ON" state.

Figure 8:
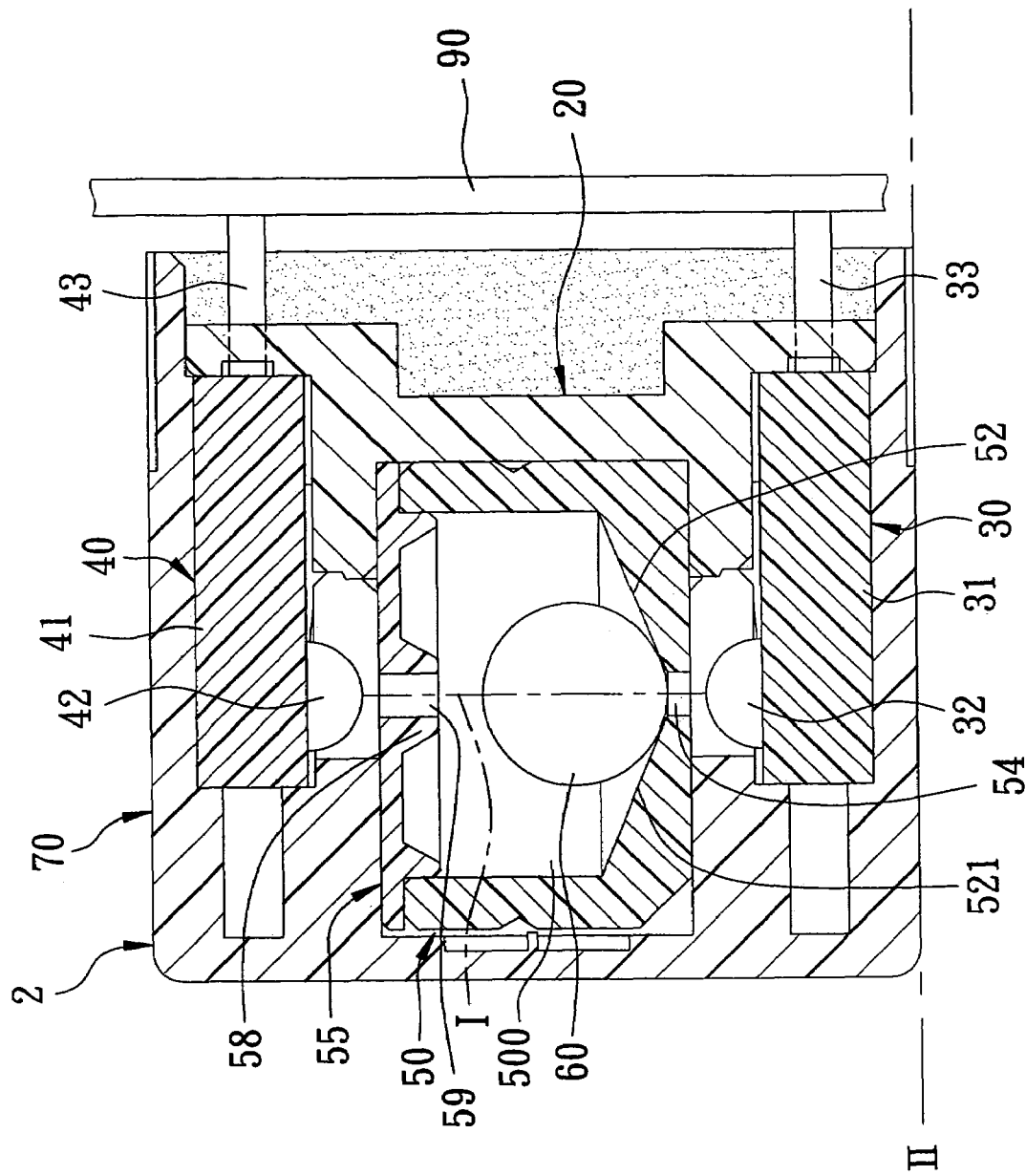
FIG. 8 is a view similar to FIG. 6, but with the ball member in a blocking position.
Figure 9:
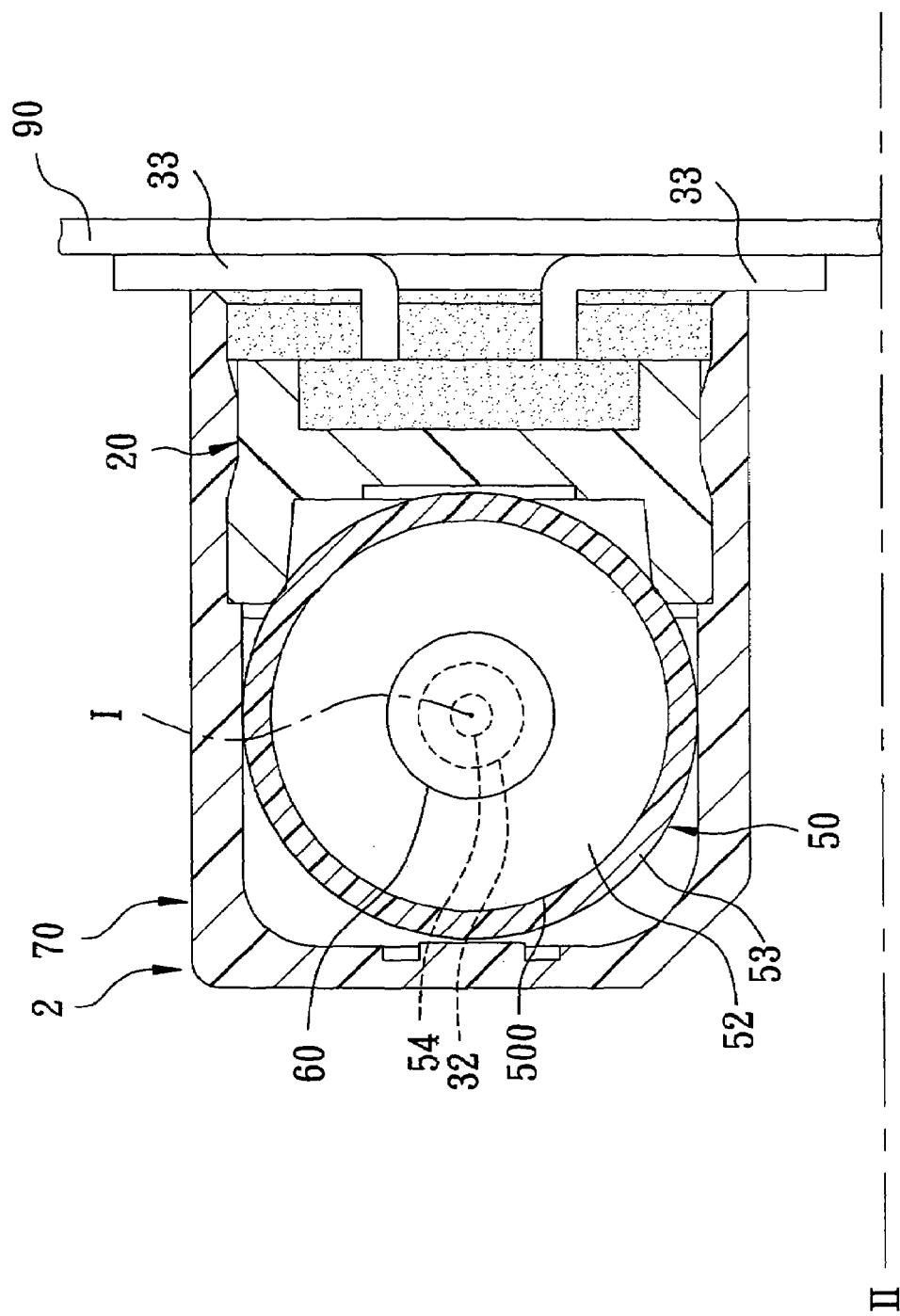
FIG. 9 is a view similar to FIG. 7, but with the ball member in the blocking position.

With reference to FIGS. 8 and 9, when the switch 2 is turned or tilted such that the circuit board 90 is perpendicular to the reference horizontal surface (II) and the receiver head 42 is above the emitter head 32, the ball member 60 rolls from the tubular wall 53 to the light exit hole 54 along the tapered portion 521 of the chamber 500, and blocks the light path (I), thereby cutting communication between the emitter 30 and the receiver 40. This results in transition of the switch 2 to an "OFF" state.

Figure 10:
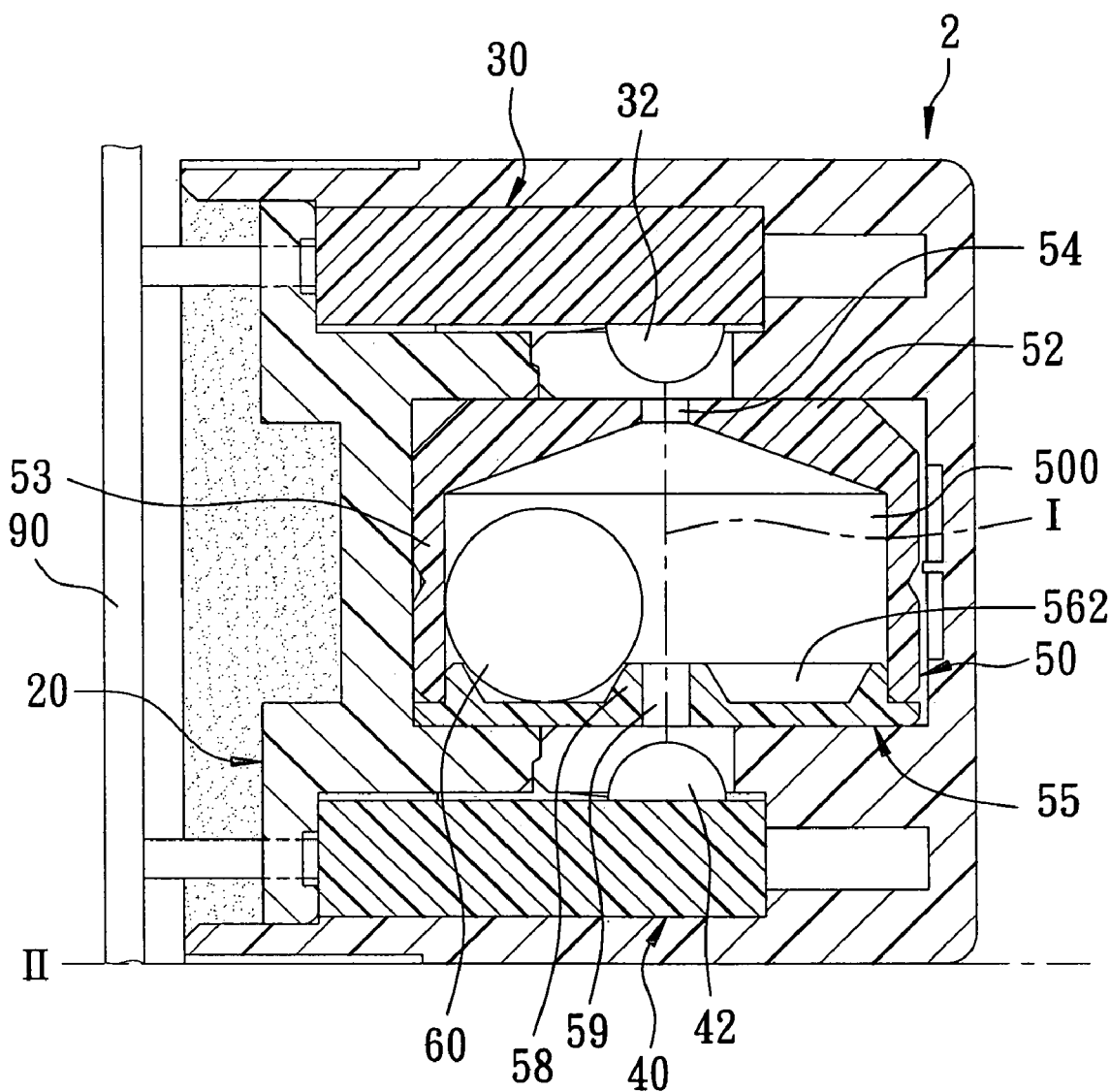
FIG. 10 is a view similar to FIG. 6, but with a circuit board vertical to a reference horizontal surface.

With reference to FIG. 10, when the switch 2 is turned such that the circuit board 90 is perpendicular to the reference horizontal surface (II) and such that the first wall 52 and the tubular wall 53 are located above the second wall 55, the ball member 60 falls down to the inner surface of the second wall 55. In this state the projection 58 controls the ball movement by preventing the ball member 60 from moving toward the light entry hole 59, so that the light path (I) is unblocked. This ensures that the switch 2 is maintained in the "ON" state.

Figure 11:
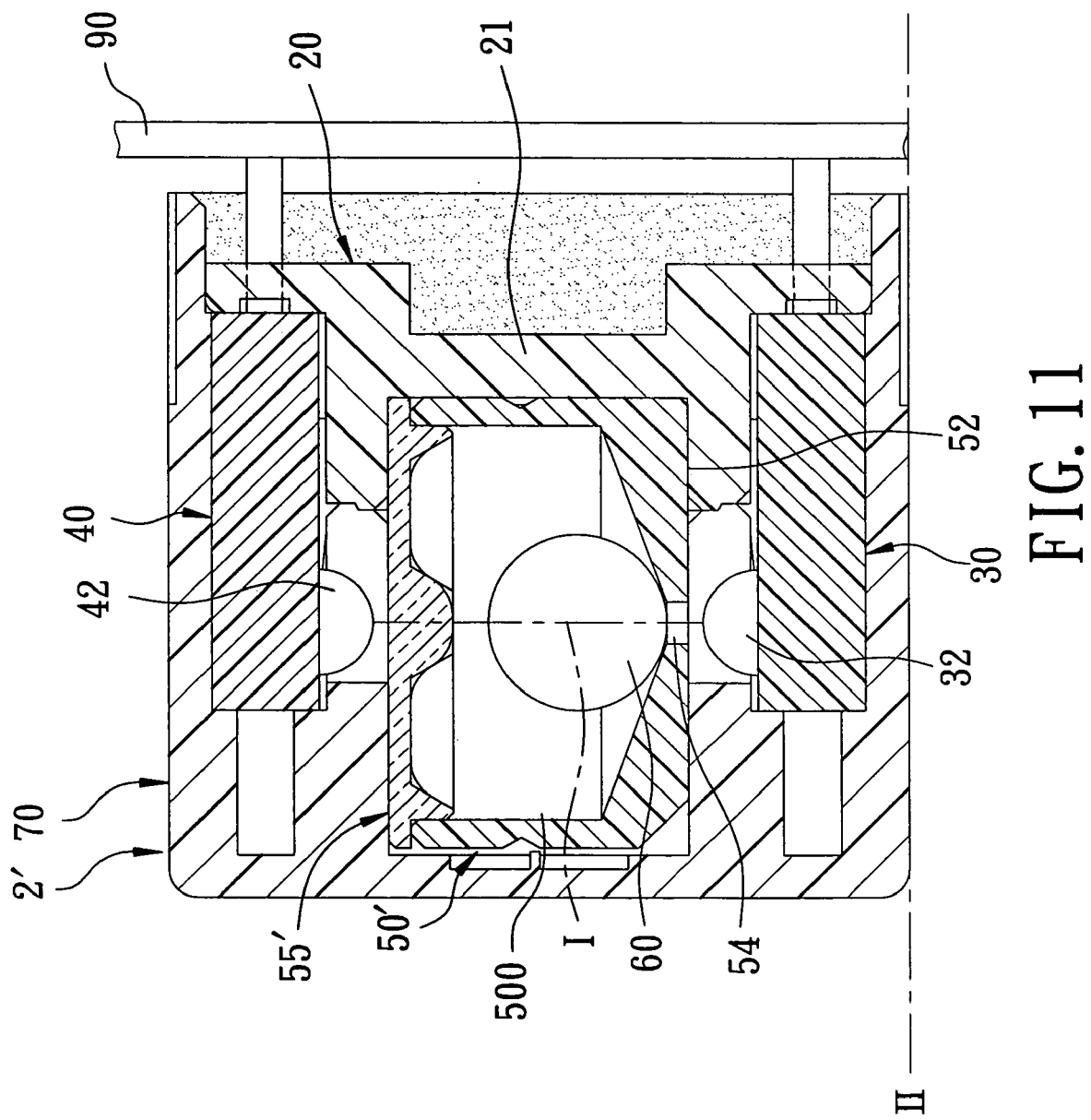
FIG. 11 is an assembled sectional view of a second embodiment of a switch.

Referring to FIG. 11, a switch 2' is shown to be similar to the first preferred embodiment. However, in this embodiment, the second wall 55' of the receptacle 50' is made of a transparent material so that the light entry hole 59 (see FIG. 4) is dispensed herewith. The light signal emitted by the emitter head 32 can pass consecutively through the light exit hole 54, the chamber 500, and the second wall 55' 50 as to be received by the receiver head 42. The advantages of the first preferred embodiment can be similarly attained using the second preferred embodiment.

Since the ball member 60 is non-transparent, by altering angular positions of the switch 2', the ball member 60 can similarly block and unblock the light path (I) to thereby shift the switch 2 between the "OFF" and "ON" states.

Figure 12:
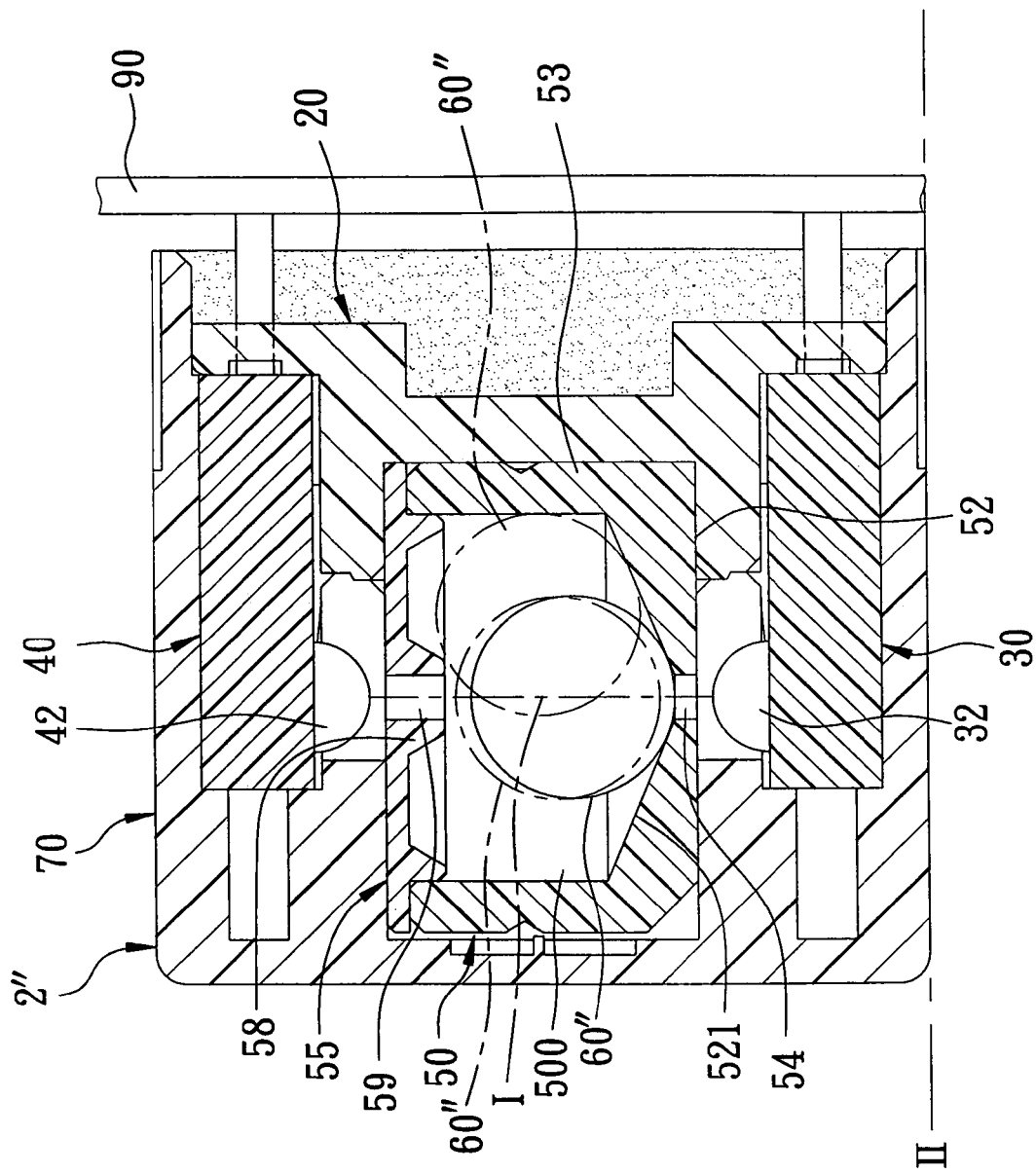
FIG. 12 is an assembled sectional view of another preferred embodiment of a switch according to the present invention.

Referring to FIG. 12, a switch 2" according to another preferred embodiment of the present invention is shown to be similar to the first preferred embodiment. However, in this embodiment, the ball member 60" is made of a transparent material, and has a diameter larger than a distance from the tubular wall 53 to the light path (I).

In use, when the switch 2" is turned or tilted so as to roll the ball member 60", the light beam emitted by the emitter head 32 is refracted by the ball member 60" and is received by the receiver head 42. During rolling of the ball member 60", different illumination levels are produced at the receiver head 42 depending on the position of the ball member 60". The switch 2" may be designed such that signals for the ON or OFF state are generated according to predetermined differences of illumination levels compared to a reference illumination level measured when the ball member 60" is in a predetermined position.

From the aforementioned description, the advantages of the switch 2, 2', 2" of the present invention can be summarized as follows:

Because the ball member 60, 60" is disposed within the chamber 500 of the receptacle 50, 50', and because the second wall 55, 55' of the receptacle 50, 50' is provided with the projection 58 that can prevent the ball member 60, 60" from blocking the light exit hole 54 and the light path (I), the rate of erroneous operation of the switch 2, 2', 2" can be effectively reduced.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A switch comprising:
   a housing;
   an emitter including an emitter main body disposed in said housing, and an emitter head to emit a light signal;
   a receiver including a receiver main body disposed in said housing, and a receiver head to receive the light signal;
   a receptacle disposed in said housing, and including a first wall proximate to said emitter and having a light exit hole aligned with said emitter head, a second wall proximate to said receiver, and a tubular wall connected between said first and second walls, said first and second walls and said tubular wall defining a chamber having a tapered portion that gradually converges from said tubular wall toward said light exit hole, said first wall and said tubular wall being formed integrally, said second wall being a plate that is formed separately from said tubular wall, said second wall having a projection projecting into said chamber from an inner surface of said second wall, said plate of said second wall having an annular protrusion surrounding said projection and abutting against an inner surface of said tubular wall, and a light entry hole that extends through said second wall and said projection, said emitter head, said light exit hole, said light entry hole, and said receiver head being aligned with each other along a light path; and
   a ball member rollable within said chamber, and in certain positions of the switch the projection controls the ball movement with respect to the light path.

2. The switch of claim 1, wherein said housing includes:
   a base having a bottom wall, a surrounding wall extending upwardly from a peripheral end of said bottom wall and cooperating with said bottom wall to define a lower recess, and first and second extension parts extending outwardly and respectively from two opposite sides of said bottom wall, said emitter and said receiver being mounted respectively on said first and second extension parts; and
   a cover body including a top wall, and a surrounding wall extending downwardly from a peripheral end of said top wall and surrounding said base and said emitter and receiver main bodies.

3. The switch of claim 1, wherein said second wall is made of a non-transparent material.

4. The switch of claim 1, wherein said second wall is made of a transparent material.

5. The switch of claim 1, wherein said ball member is made of a non-transparent material, and has a diameter smaller than a distance from said tubular wall to said light path.

6. The switch of claim 1, wherein said ball member is made of a transparent material, and has a diameter larger than a distance from said tubular wall to said light path.

* * * * *